United States Patent [19]

Harra et al.

[11] 4,392,938

[45] Jul. 12, 1983

[54] RADIO FREQUENCY ETCH TABLE WITH BIASED EXTENSION MEMBER

[75] Inventors: David J. Harra, Santa Cruz; Frederick T. Turner, Sunnyvale, both of Calif.

[73] Assignee: Varian Associates, Inc., Palo Alto, Calif.

[21] Appl. No.: 320,385

[22] Filed: Nov. 12, 1981

[51] Int. Cl.³ .............................................. C23C 15/00
[52] U.S. Cl. ................................. 204/298; 204/192 E
[58] Field of Search ........................... 204/192 E, 298; 156/345, 643

[56] References Cited

U.S. PATENT DOCUMENTS 3,730,873  5/1973  Pompei et al. ...................... 204/298

OTHER PUBLICATIONS

Y. Budo et al., "Ground Shield in RF Sputter Etching", *IBM Tech. Disc. Bull.*, vol. 13, p. 1296, (1970).

*Primary Examiner*—Aaron Weisstuch
*Attorney, Agent, or Firm*—Stanley Z. Cole; Norman E. Reitz

[57] ABSTRACT

An RF etch table has a biased extension member positioned adjacent its periphery. The extension member is electrically conductive, but is insulated from other conductive members in the system. The extension member is positioned with respect to the periphery of the table in a manner such that the boundary of the plasma induced above the etch table is continued beyond the periphery of the etch table, thereby eliminating the focusing of ions onto the edges of an item being etched on the table. The potential impressed upon the extension member produces a dark space above its surface having a sufficient height so that the horizontal configuration of the sheath above the etch table is continued beyond its edges. More uniform etching is accomplished.

11 Claims, 8 Drawing Figures

RADIO FREQUENCY ETCH TABLE WITH BIASED EXTENSION MEMBER

This invention relates to apparatus for obtaining a more uniform etch on a semiconductor wafer and, more particularly, relates to a radio frequency (RF) etch table having a biased member positioned adjacent its periphery to permit a more uniform rate of etch to be obtained on a semiconductor wafer.

In the fabrication of semiconductor components, it is necessary at various points in the fabrication process to etch the surface of the wafer. These points include etching to clean a surface prior to the application of metallization or prior to carrying out an epitaxial growth step. And they include the delineation of a pattern in metallization or in an oxide by selective etching of a layer partially covered with photoresist. The conventional approach has been to use chemical etchants. Increasingly, however, so-called dry etching techniques are used. These techniques include sputter etching, ion beam milling, and reactive ion etching. Sputter etching, sometimes called plasma etching, is well known in the art. See, for example, G. N. Jackson, "R. F. Sputtering," *Thin Solid Films*, vol. 5, pp. 209, 236 et seq. (1970) and R. Glang, et al., "Generation of Patterns in Thin Films," in *Handbook of Thin Film Technology*, pp. 7–49 (1970). The theory of operation of sputter etching is briefly stated as follows. The substrate is maintained at a high potential, either DC or RF, and a glow discharge plasma is induced above the surface of the substrate. The plasma consists of a mixture of electrons, ions and neutral atoms or molecules; the number of ions and electrons are almost equally balanced so that the net charge is near zero and movement of the ions is by diffusion rather than by drift in an impressed electric field. In the space immediately above the substrate and below the plasma there exists a region called the dark space in which no significant number of electrons are found. When positive ions diffuse to the boundary between the dark space and the plasma, sometimes called the plasma sheath, they are no longer masked by the electrons and are extracted by the potential of a negatively charged substrate. They are drawn to the surface of the item placed on the etch table and strike it to thereby produce etching.

Uniform etching across the surface of a semiconductor wafer is becoming increasingly important in the fabrication of semiconductor devices. This is true as the level of integration increases and the minimum line width of lithographic features decreases. Small lithographic features could be destroyed in high etch regions while satisfactory etching would be experienced elsewhere on a semiconductor wafer. Consequently, it is often desirable and necessary to carry out etching to within a uniformity of plus or minus 10%. Etch uniformity has been attempted by the use of electrically floating shields, R. Mundt, et al., "Etch Uniformity in a $CCl_4$ Plasma Aluminum Etch," *Proceedings, Int'l. Electron Device Meeting*, 1980, p. 16.3; and by placement of the item to be etched in the center of a large etch table, R. S. Howicki, "Properties of RF-Sputtered $Al_2O_3$ Films Deposited by Planar Magnetron," *J. Vac. Sci. Tech.*, vol. 14, No. 1, p. 127 (1977).

With RF sputter etching it is known that it is necessary to maintain a constant dark space height above the substrate in order to produce uniform etching. This condition must be met because the relative height of the plasma sheath will determine the number of ions extracted and the direction of their initial trajectories toward the substrate and thus will determine the uniformity of etching rate. In addition, at the periphery of a substrate being etched the plasma sheath will curve down to meet the grounded structures surrounding the edge of the etch table. This produces a focusing effect since ions extracted from the plasma near the periphery of the etch table will have converging trajectories so that more ions will impinge on the outer edges of the substrate. Thus, in order to obtain uniform etch rates with RF etch tables it has been the practice to make the tables planar and much larger than the item being etched to avoid focusing effects around the periphery of the item being etched or to shape the surrounding ground electrode to produce termination of the plasma away from the edges of the semiconductor wafer.

It is an object of the present invention to provide an RF etch table which permits a semiconductor wafer to be etched more uniformly.

It is a further object of the present invention to provide an RF etch table having a biased extension member positioned around the periphery of the table to extend the boundary of the plasma sheath.

It is another object of the present invention to provide an RF etch table having a peripheral extension member to which a known bias is applied in order to maintain an essentially uniform dark space height above the table at least over the distance on which a substrate is to be placed.

BRIEF DESCRIPTION OF THE DRAWINGS

For a more complete understanding of the present invention, reference may be had to the accompanying drawings which are incorporated herein by reference and in which.

SUMMARY OF THE INVENTION

An RF etch table is provided with a biased extension member adjacent its periphery. The extension member is electrically conductive, but is insulated from other conductive members in the system. The extension member is positioned with respect to the periphery of the table in a manner such that the boundary of the plasma induced above the etch table is continued beyond the periphery of the etch table, thereby eliminating the focusing of ions onto the edges of an item being etched on the table. The potential impressed upon the extension member produces a dark space above its surface having a sufficient height so that the horizontal configuration of the sheath above the etch table is continued beyond its edges.

DESCRIPTION OF THE PREFERRED EMBODIMENT

Etching in an RF plasma is carried out by the positive ions that are extracted from the plasma when the positive ions diffuse to the boundary between the dark space and the plasma region. The positive ions are attracted by the high negative bias on the substrate. If the substrate is planar, e.g., a semiconductor wafer, then the ideal configuration for the plasma sheath over the wafer would be a planar sheath larger than the substrate and coplanar with it. The ions would be generated as if from an infinite planar source and every point on the substrate would experience the same ion flux. In practicable systems, however, the sheath is curved at the edges due to the finite size of the etch table and the fact that structures surrounding the etch table are grounded. Consequently, a greater number of ions are extracted around the periphery and directed at the edges of the etch table in a manner such that their trajectories converge on the edges of the wafer being etched.

Various techniques and apparatus have been utilized to reduce non-uniformities in sputter etching. For example, as discussed in the section "Uniformity" in G. N. Jackson, "RF Sputtering," *Thin Solid Films*, v. 5, p. 290 at pp. 236–239 (1970), uniformity has been reported to be enhanced by changing the position of ground shielding and by applying magnetic fields. These approaches have not been found to produce the high uniformities, on the order of plus or minus 10%, that are now being sought in semiconductor fabrication. Another crude but effective approach is to make the etch table much larger than the item being etched so that in the central region in which etching occurs, the flux of ions is essentially constant. In practicable systems, however, not enough space can be committed to nor cost allowed for the etch table to permit this solution to be adopted.

Figure 6:
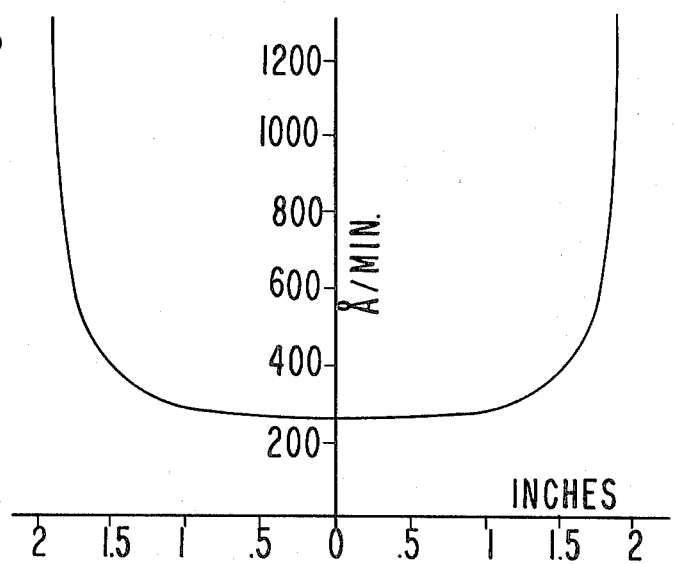
FIG. 6 is a graph showing etch rate in A°/minute of aluminum placed on a conventional RF etch table.
Figure 4:
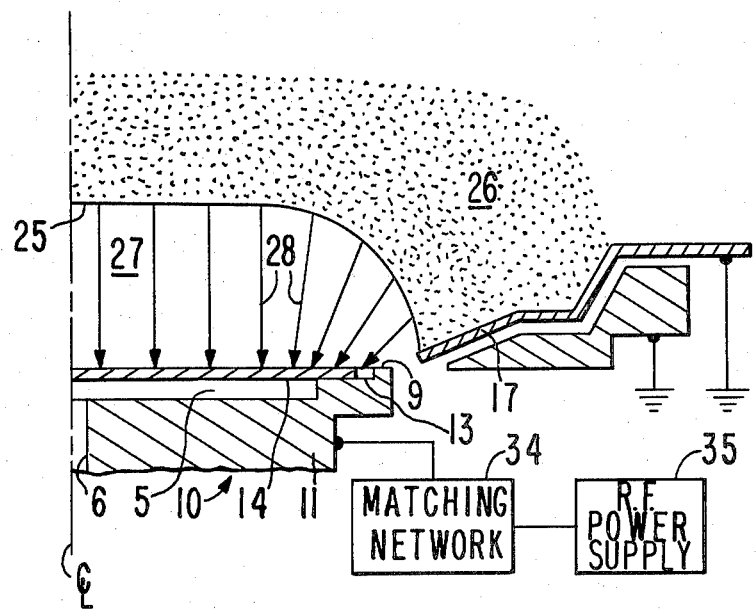
FIG. 4 is a schematic view of the plasma sheath over a conventional RF etch table.

The apparatus of the present invention produces an extension of the plasma sheath beyond the edge of the etch table in order to achieve the uniform etching of a semiconductor wafer placed on the table. The manner in which this is accomplished may be seen by comparing the schematic illustrations of FIGS. 4 and 5. The conventional etch table shown schematically in FIG. 4, comprises a table 10 having a base structure 11 and a circumferential lip 13 on which a semiconductor wafer 14 rests. Wafer 14 lies above open region 5 to permit gas conduction cooling when a gas is introduced through central conduit 6, an important feature due to the high power densities experienced in sputter etching. Table 10 is maintained at a high RF potential on the order of kilovolts by being capacitively coupled through matching network 34 to RF power supply 35. A plasma 26 is generated above etch table 10 and is separated from semiconductor wafer 14 by dark space region 27. Ions are extracted across plasma sheath 25, the boundary between plasma 26 and dark space region 27, and travel along trajectories 28 to reach the surface of wafer 14. In the prior art, structural member 17, which surrounds periphery 9 of etch table 10, is maintained at machine potential, which is typically ground potential. The dark space disappears beyond the edge of etch table 10 and plasma sheath 25 curves down to meet structural member 17. As a consequence, more ions are produced near the edge of the etch table and etch rates are much higher near the edge than in the center. For example, FIG. 6 shows the etch rate in A°/minute of an aluminum film on a semiconductor wafer placed on a conventional etch table in an argon plasma. The etch rate is more than five times greater at the periphery than in the center.

Figure 2:
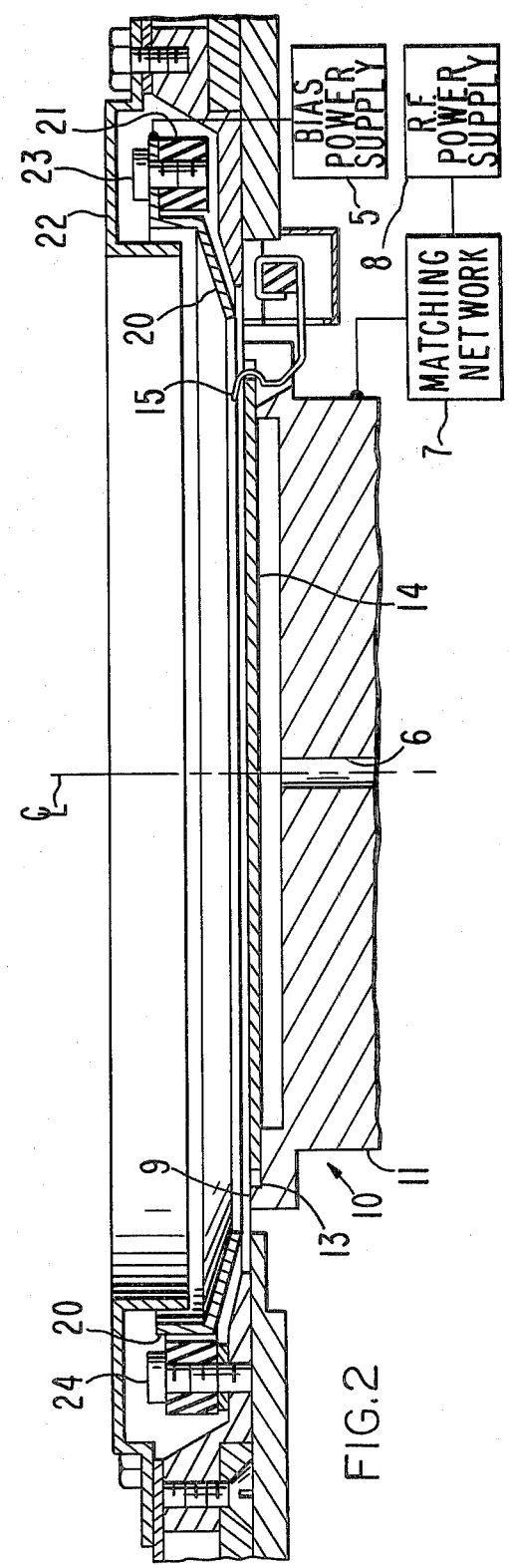
FIG. 2 is a cross-sectional view of the RF etch table of the present invention.
Figure 5:
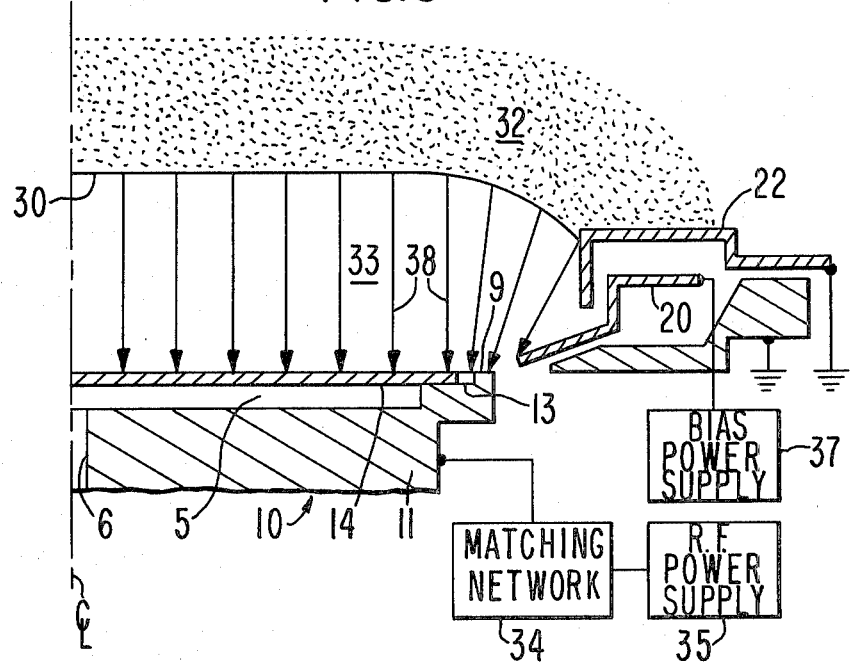
FIG. 5 is a schematic view of the plasma sheath over the RF etch table of the present invention.

The schematic illustration of FIG. 5 shows the extended plasma sheath 30 of the present invention. The sheath 30 forms the boundary between plasma region 32 and dark space region 33. As with conventional RF etch tables, semiconductor wafer 14 rests in lip 13 of base 11 and table 10 is connected through matching network 34 to RF power supply 35. Gas conduction cooling is accomplished through open region 5 when gas is introduced through central conduit 6. With the apparatus of the present invention, however, the plasma sheath 30 is extended due to the presence of an electrically conductive extension member 20 which is positioned adjacent the periphery 9 of etch table 10. Bias power supply 37 applies a bias to extension member 20. It has been found that a bias must be applied to extend the plasma sheath since a grounded member draws the plasma sheath down and a floating electrode assumes a potential far different than required to maintain a horizontal plasma sheath. Extension member 20 is attached to external support members (not shown) and is electrically isolated from the machine, from ground and from etch table 10. Preferably, the bias potential applied to extension member 20 is a DC potential. An RF bias potential may be used but should be isolated from the RF source of the etch table in order to not draw power away from the table. The preferred value for the potential is that which is sufficient to horizontally extend the sheath beyond the working portion of the etch table, yet not so great that the plasma sheath curves upwards and a deficiency of ions are produced around the periphery of etch table 10. Typically, bias power supply 37 will supply a DC voltage in the range of −100 volts to −1000 volts. The actual value of the potential will depend upon the position of the extension member above the surface of the etch table. A quantitative discussion of these preferred values is given in a subsequent paragraph. With extension member 20 in place, the focusing of ions still occurs, but does so farther out as shown by trajectories 38 so that the wafer experiences uniform etching. In one embodiment (not shown), member 20 is the sole peripheral structural feature. In the embodiment of FIGS. 2 and 5, a ground shield 22 is used to shield insulator 21 (see FIG. 2) from becoming coated by sputtered metals so that it becomes conductive.

Figure 7:
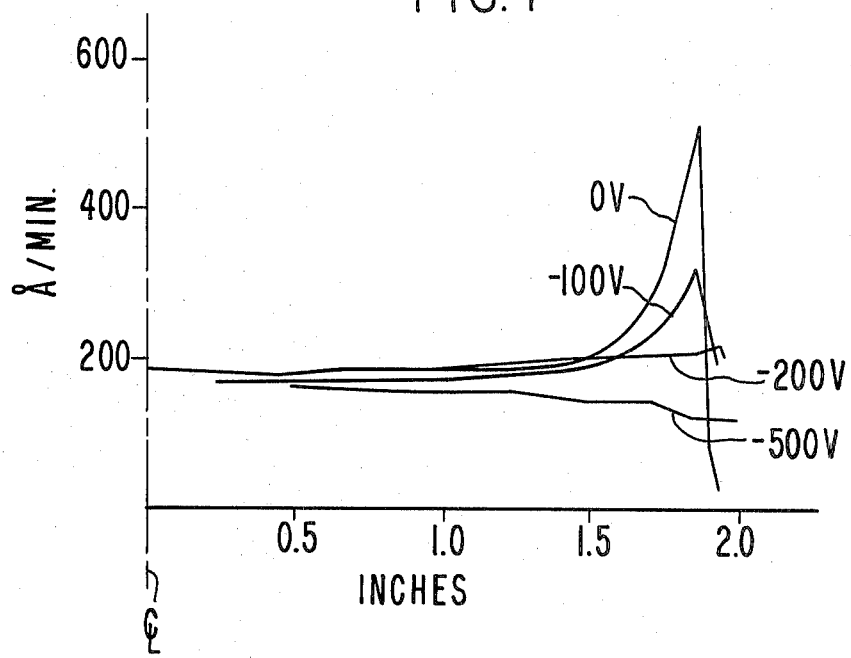
FIG. 7 is a graph showing etch rate of aluminum placed on the RF etch table of the present invention with the etch table being maintained at a voltage of $-1200$ volts and the extension member being maintained, respectively, at voltages of 0, $-100$, $-200$ and $-500$.
Figure 8:
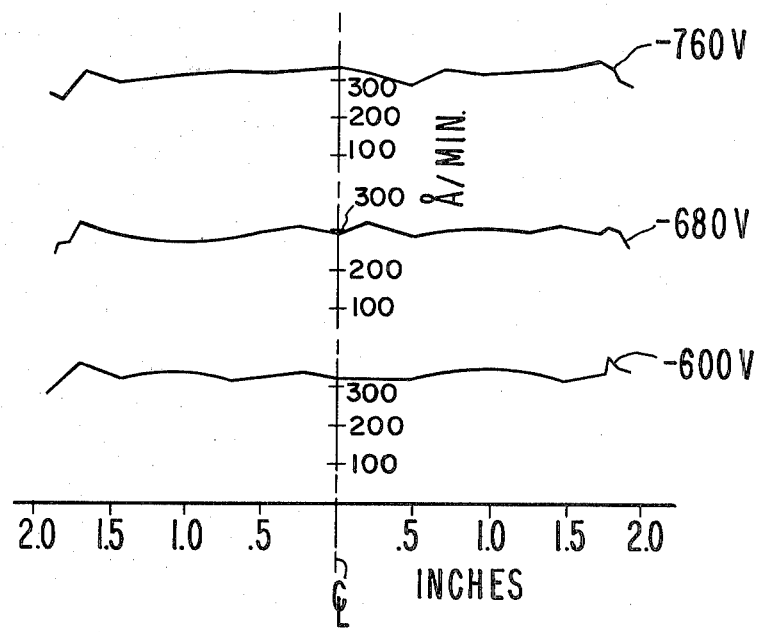
FIG. 8 is a graph showing etch rate in $SiO_2$ placed on the RF etch table of the present invention with the etch table being maintained at $-2000$ volts and with the biased member being maintained, respectively, at $-600$, $-680$ and $-760$ volts.

The uniformity of etching with the present invention is shown in FIGS. 7 and 8. FIG. 7 is a composite graph showing etch profiles in an aluminum film formed on a silicon wafer of 100 mm diameter. The etch table is maintained at a potential of −1200 volts. The extension member 20 is elevated 4 mm above the surface of etch table 10. The curves are labeled to show the various DC potentials applied to extension member 20 by bias power supply 37. The flatness of the curve is a measure of uniformity. With no applied bias, the etching at the periphery of the wafer is more than twice the rate on the center of the wafer. With an applied bias of −100 volts, the peripheral etching is reduced to about one and one-half times central etching. With an applied bias of −200 volts, the peripheral etching is slightly higher than in the center; uniformity appears to be within plus or minus 9 percent. With an applied bias of −500 volts, peripheral etching appears to be less than etching in the center by about 20 percent. These results are fairly interpreted as showing the shifting of the plasma sheath above the periphery of the etch table from an elevation below the level at the center to an elevation above the level at the center. At an applied bias slightly below −200 volts, a nearly horizontal extension of the plasma sheath must occur; this is the preferred condition for the most uniform etching. The existence of a single optimum potential is confirmed by FIG. 8, a graph showing etch profiles in SiO₂ on an etch table maintained at −2000 volts. As the potential on extension member 20 is reduced from −760 volts to −600 volts, the peripheral etch rate increases until it is greater than the central rate.

The position of the extension member with respect to the edge of the etch table is determined in accordance with the following considerations. The extension member must be placed laterally close to the edge of the etch table so that the plasma does not have significant line of sight exposure to a grounded member until beyond the periphery of the etch table. If such exposure were provided, then the plasma sheath would not be a horizontal extension of the sheath above the etch table, but would experience a dip in this region. The height of the extension member may vary from a position beneath the level of the etch table to a position above the level of the etch table. From Vossen, *Thin Film Processing*, p. 85, (1978), it is known that the current density from a plasma is given by $$J = 27.3 \left( \frac{40}{M} \right)^{\frac{1}{2}} \frac{V^{3/2}}{d^2}$$

where
d = dark space height (in mm)
V = voltage on etch table (in kv)
M = molecular weight of sputtering atom
J = current density in ma/cm²

This can be converted to a value for the height of the dark space in terms of the voltage on a conductive surface and the ion current:

$$d = \left( 27.3 \left[ \frac{40}{M} \right]^{\frac{1}{2}} \frac{V^{3/2}}{J} \right)^{\frac{1}{2}}$$

This formula can also be used to estimate the height of the dark space above the extension member for a number of voltages and associated currents obtained in conjunction with a pressure of 6×10⁻³ Torr:

| V | I(ma) | J(ma/cm²) | Dark Space Height (mm) | Dark Space Height (inches) |
|---|---|---|---|---|
| −760 | 17 | 0.73 | 4.9 | 0.196 |
| −680 | — | — | 4.57 | 0.180 |
| −600 | 17 | 0.73 | 4.16 | 0.164 |
| −400 | 12 | 0.52 | 3.64 | 0.143 |
| −200 | 12 | 0.52 | 2.38 | 0.093 |
| −100 | 10 | 0.43 | 1.41 | 0.056 |

For the extension member itself, then, it is clear that the dark space height and thus the position of the plasma sheath above the extension member will be a function of the applied bias voltage. For a given value for the applied bias the position of the plasma sheath rises if the position of the extension member is raised and the position of the plasma sheath is lowered if the position of the extension member is lowered. For an extension member held in a fixed position, the position of the plasma sheath rises if the applied bias voltage is increased and the position of the plasma sheath is lowered if the applied bias voltage is reduced. In the preferred embodiment, the extension member is elevated above the horizontal level of the etch table to permit a lesser voltage to be applied to the extension member while yet obtaining a horizontal extension of the plasma sheath beyond the edge of the etch table. It has been found that the position of the extension member above the etch table should not be so high that grounded structures around the periphery of the etch table are thereby significantly exposed in a line-of-sight manner to the plasma, and yet should not be so low or close to the edge of the etch table that incidental sputtering of the extension member produces metal impurities which contaminate the surface of the semiconductor wafer being etched. For a typical RF etch table self bias potential of −2000 volts the position of the bias ring above the etch table will range from about 2 to about 4 mm and the applied bias voltage will range from about −200 to about −800 volts. Thus, the preferred ring bias potential is from 0.1 to 0.4 times the self bias potential on the etch table.

Figure 1:
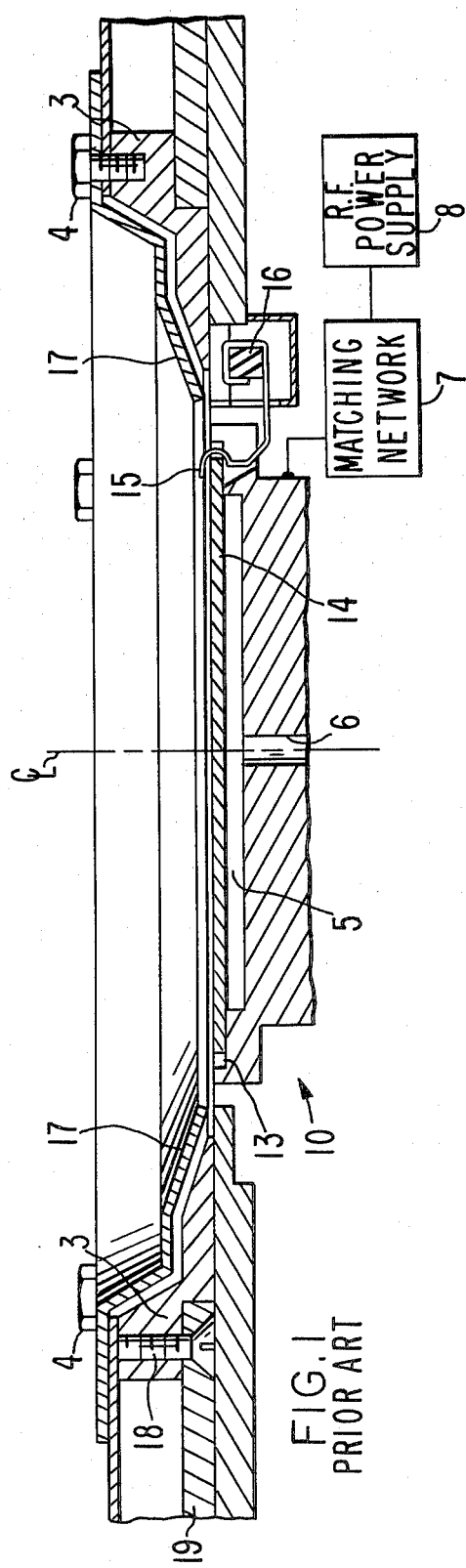
FIG. 1 is a cross-sectional view of a conventional RF etch table.

An etch table of the prior art is shown in cross-section in FIG. 1. A table 10 of generally circular shape is configured with a wafer receiving lip 13 and an open region 5. When a wafer 14 is in position to be etched by a plasma (not shown), conductive cooling of the wafer is accomplished by a gas introduced through channel 6 to open region 5; this cooling is accomplished, for example, in the manner set out in M. King, "Method for Conducting Heat to or From an Article Being Treated Under Vacuum," U.S. Pat. No. 4,261,762. Table 10 is maintained at a high RF potential by being capacitively coupled through matching network 7 to RF power supply 8. Wafers are held in place by clips 15 which are attached to insulated post 16, for example, in the manner set out in copending application of R. Shaw, "Wafer Support Assembly," application Ser. No. 106,179, filed Dec. 21, 1979, now U.S. Pat. No. 4,306,731. The etch table 10 is surrounded by a structural member 17 such as a pressure plate or a grounded shield. Structural member 17 is affixed by screws 4 to structural member 3 which is affixed to machine support 19 by screw 18. Thus, structural member 17 is the closest physical entity above and adjacent the edge of the etch table, and is maintained at machine potential which is typically ground potential. In operation, the plasma generated above etch table 10, and thus above semiconductor wafer 14, is constrained to the region immediately above the table and wafer since a high voltage is required to induce and sustain the plasma. The machine potential of the surounding structure is not sufficient to induce and sustain a plasma so the plasma sheath reaches down and terminates on the grounded structure.

Figure 3:
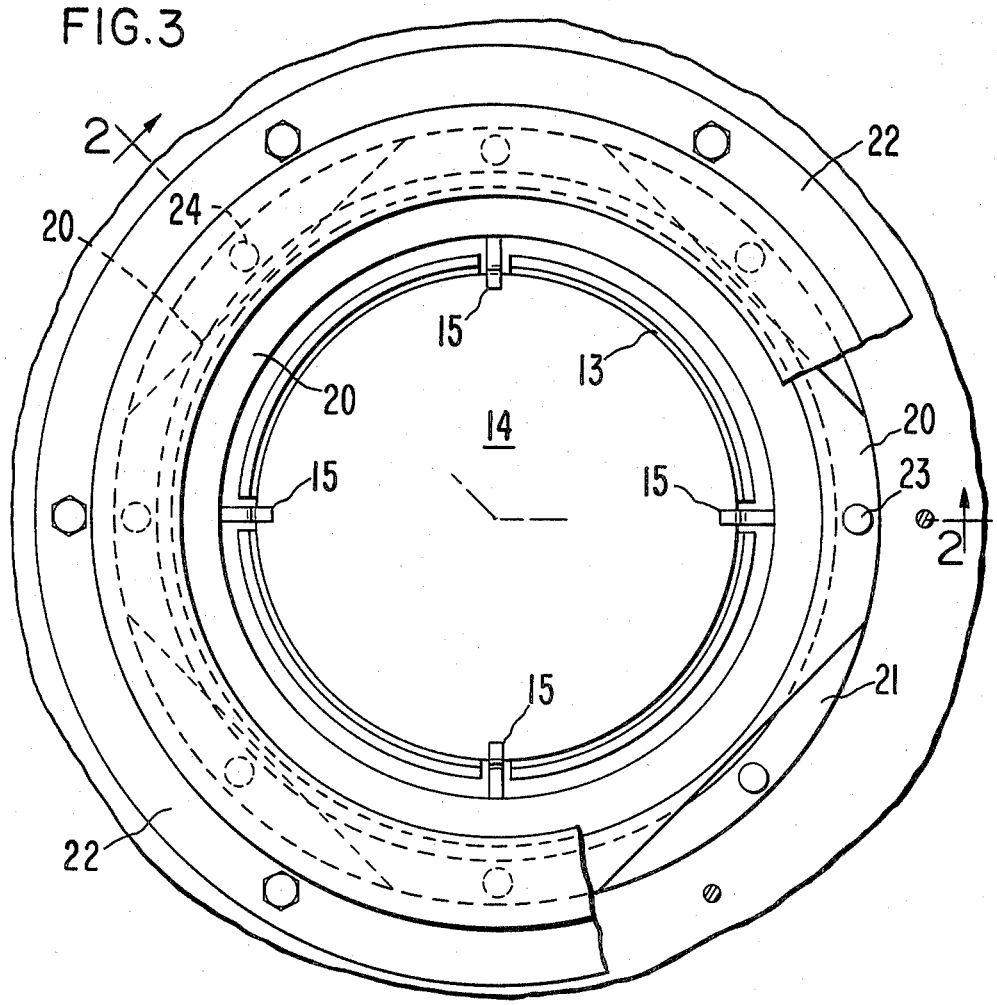
FIG. 3 is a plan view of the RF etch table of FIG. 2.

An etch table of the present invention is shown in FIGS. 2 and 3. In common with the prior art etch table, a high RF voltage is applied to base structure 11 of table 10 by RF power supply 8 through matching network 7. Clips 15 hold semiconductor wafer 14 in place on receiving lip 13. Distinct from the prior art, however, extension member 20, the closest physical entity above and adjacent the edge of the etch table, is electrically insulated from the machine by ceramic insert 21. Ceramic insert 21 is affixed to machine support structure by screws 24. Shield 22 is used to protect ceramic insert 21 from becoming coated and thereby becoming conductive. Extension member 20 is affixed to ceramic insert 21 by means of screws 23. The potential on extension member 20, and thus the potential condition in the region just beyond the periphery 9 of the etch table, is determined by the voltage applied by bias power supply 5. In operation, the potential on extension member 20 is maintained substantially below ground or machine level, but not as negative as the level of the etch table. As discussed previously, this potential is preferably in the range of 0.1 to 0.4 times the etch table potential, while the extension member is positioned about 2-4 mm above the level of the etch table. Most preferably, the potential is in the range of 0.2 to 0.3 times the etch table potential.

What is claimed is:

1. An RF etch table for uniformly etching a semiconductor wafer by sputtering, comprising,
    a table structure adapted to receive and hold a generally circular semiconductor wafer to be subjected to sputter etching;
    an RF power supply electrically connected to said table structure;
    an extension member positioned adjacent the periphery of said table, said extension member being electrically conductive and being insulated from other conductive members;
    a bias power supply means for applying an electrical potential to said extension member whereby the plasma generated above said table structure extends horizontally beyond the periphery of said etch table and above at least a portion of said extension member; and
    a shielding member placed over said extension member, but not in electrical communication with said extension member, whereby said biased extension member is protected from unwanted sputtering to thereby avoid metallic contamination of said semiconductor wafer.

2. An RF etch table in accordance with claim 1 wherein said RF power supply is capacitively coupled to said etch table.

3. An RF etch table in accordance with claim 1 wherein said table structure includes means to produce active cooling of said semiconductor wafer.

4. An RF etch table in accordance with claim 3 wherein said means to produce active cooling comprises means to accomplish gas conduction cooling.

5. An RF etch table in accordance with claim 1 wherein said extension member is positioned above the level of the top surface of said table structure and below the low boundary of the plasma sheath produced above said table structure.

6. An RF etch table in accordance with claim 5 wherein said extension member is positioned from 2 mm to 4 mm above the level of said table structure.

7. An RF etch table in accordance with claim 1 wherein said bias power supply means applies electrical potential in the range of 0.1 to 0.4 times the potential on said table structure.

8. An RF etch table structure in accordance with claim 7 wherein said bias power supply means applies an electrical potential in the range of 0.2 to 0.3 times the potential on said table structure.

9. An RF etch table in accordance with claim 1 wherein said table structure is circular in shape and wherein said extension member comprises a ring positioned in annular, concentric fashion around said circular table structure.

10. An RF etch table in accordance with claim 1 wherein said shielding member is connected to ground.

11. An RF etch table in accordance with claim 10 wherein said bias power supply applies a negative potential to said biased extension member.

* * * * *